(12) United States Patent
Kim et al.

(10) Patent No.: US 11,094,901 B2
(45) Date of Patent: Aug. 17, 2021

(54) NDR DEVICE AND CIRCUIT HAVING A NEGATIVE DIFFERENTIAL RESISTANCE BASED ON ORGANIC-INORGANIC HYBRID HALIDE PEROVSKITE

(71) Applicant: Korea Advanced Institute of Science and Technology, Daejeon (KR)

(72) Inventors: Yong-Hoon Kim, Daejeon (KR); Muhammad Ejaz Khan, Daejeon (KR); Juho Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 101 days.

(21) Appl. No.: 16/673,116

(22) Filed: Nov. 4, 2019

(65) Prior Publication Data

US 2020/0295284 A1 Sep. 17, 2020

(30) Foreign Application Priority Data

Mar. 13, 2019 (KR) .................. 10-2019-0028622
Aug. 7, 2019 (KR) .................. 10-2019-0096130

(51) Int. Cl.
| H01L 51/05 | (2006.01) |
| G11C 11/39 | (2006.01) |
| H01L 51/00 | (2006.01) |
| H01L 51/10 | (2006.01) |
| B82Y 10/00 | (2011.01) |

(52) U.S. Cl.
CPC .......... *H01L 51/0587* (2013.01); *G11C 11/39* (2013.01); *H01L 51/0017* (2013.01); *H01L 51/0077* (2013.01); *H01L 51/105* (2013.01); *B82Y 10/00* (2013.01)

(58) Field of Classification Search
None
See application file for complete search history.

(56) References Cited

FOREIGN PATENT DOCUMENTS

| KR | 10-2009-0026500 | 3/2009 |
| KR | 10-2016-0055089 | 5/2016 |

OTHER PUBLICATIONS

"Semimetallicity and Negative Differential Resistance from Hybrid Halide Perovskite Nanowires" by Khan et al. (Year: 2019).*
"Multiple negative diferential resistance in perovskite (CH3NH3PbI3) decorated electrospun TiO2 nanofbers" (Year: 2020).*
Khan, Muhammad E. et al., Nanostructuring of Hybrid Halide Perovskites Down to Stable Lowe-Dimensional and Semi-Metallic Analogs: An ab initio study, Korean Physical Society Spring Meeting Apr. 25-27, 2018, Daejeon, Korea.

(Continued)

*Primary Examiner* — Evren Seven
(74) *Attorney, Agent, or Firm* — Dickinson Wright PLLC

(57) ABSTRACT

A quantum hybridization negative differential resistance device having negative differential resistance (NDR) under a low voltage condition using a nanowire based on an organic-inorganic hybrid halide perovskite, and a circuit thereof are provided. The quantum hybridization negative differential resistance device includes a channel formed of an organic-inorganic hybrid halide perovskite crystal and electrodes formed of its inorganic framework and is connected to opposite ends of the channel.

8 Claims, 5 Drawing Sheets

(56) References Cited

OTHER PUBLICATIONS

Khan, Muhammad E. et al., Prediction of Semimetallicity and Negative Differential Resistance from Hybrid Halide Perovskite Nanowires, The 21st Asian Workshop on First-Principles Electronic Structure Calculations, Oct. 29-31, 2018, KAIST, Daejeon, Korea.

Kim, Yong-Hoon, Toward the 1st-Principles Design of Next-Generation Nanodevices; KAIST EE, Nov. 15, 2018, Daejeon. Korea.

Khan, Muhammad E. et al., Semimetallicity and Negative Differential Resistance from Hybrid Halide Perovskite Nanowires, School of Electrical Engineering, KAIST, [v1] Dec. 3, 2018, Daejeon, Korea https://arxiv.org/abs/1812.00729.

Khan, Muhammad E. et al., Semimetallicity and Negative Differential Resistance from Hybrid Halide Perovskite Nanowires, School of Electrical Engineering, KAIST, Jan. 7, 2019, Daejeon, Korea https://onlinelibrary.wiley.com/doi/full/10.1002/adfm.201807620.

Khan, Muhammad E. et al., "Semimetallicity and Negative Differential Resistance from Hybrid Halide Perovskite Nanowires" Adv. Funct. Mater. 29, 1807620 (2019).

Ionescu, Adrian M. et al., "Tunnel field-effect transistors as energy-efficient electronic switches", Nature, Nov. 17, 2011, vol. 479, 329-337, Switzerland.

* cited by examiner

NDR DEVICE AND CIRCUIT HAVING A NEGATIVE DIFFERENTIAL RESISTANCE BASED ON ORGANIC-INORGANIC HYBRID HALIDE PEROVSKITE

CROSS-REFERENCE TO RELATED APPLICATIONS

A claim for priority under 35 U.S.C. § 119 is made to Korean Patent Application No. 10-2019-0028622 filed on Mar. 13, 2019 and No. 10-2019-0096130 Aug. 7, 2019, in the Korean Intellectual Property Office, the entire contents of which are hereby incorporated by reference.

BACKGROUND

Embodiments of the inventive concept described herein relate to a negative differential resistance device having a negative differential resistance based on an organic-inorganic hybrid halide perovskite and a circuit thereof, more particularly, to a quantum hybridization negative differential resistance device having a negative differential resistance (NDR) at a low voltage using nanowires based on an organic-inorganic hybrid halide perovskite and a circuit thereof.

A perovskite material is an ionic crystal as an $ABX_3$ structure ("A" and "B" are cations, "X" is an anion) and is an organic-inorganic complex substance having a direct band gap. The perovskite crystal has a high absorption coefficient, is capable of thinning, and has a long charge diffusion distance, to allow a solar cell to have high efficiency. In addition, the perovskite crystal has a low exciton binding energy due to a high dielectric constant and enables high open-circuit voltages in solar cells. Since the perovskite material has solution processability, a high-efficiency optoelectronic device may be manufactured at a low cost and thus, there is a great potential in practical use.

Here, when a halogen element occupies "X" site which is an anion of the perovskite crystal, it is called a halide perovskite. A hybrid halide perovskite crystal, which has recently gained much attention in solar cell applications, is an organic-inorganic perovskite having a cation of an organic substance at "A" site, which is a cation such as $MAPbI_3$ (Chemical Formula: $CH_3NH_3PbI_3$).

The organic-inorganic hybrid halide perovskite may have excellent optical characteristics and may be synthesized by a low-cost and simple process, thereby being in the spotlight around the world for various optical applications such as solar cells, LEDs, lasers, and optical sensors. In particular, researches on the manufacturing of low-dimensional hybrid halide perovskites such as atomically thin two-dimensional nanoplatelets or one-dimensional nanowires, as implementation of new material characteristics and a device optimization method, have been actively carried out. Meanwhile, many researches have been conducted on optical devices using the low dimensional halide perovskite having a strong quantum confinement effect, but there are few studies on the application of low-dimensional halide perovskites to electronic devices.

Researches on quantum-effect devices for electronic device applications have been conducted in many contexts, such as logic and memory devices. However, since a conventional proposed tunneling and negative differential resistance (NDR) nano-devices have relatively long channel lengths of at least several tens of nanometers, there are limitations in miniaturization of a device, development of interconnect process technology to increase power transmission, and integration of the device.

Non-Patent Literature a. M. E. Khan, J. Lee, S. Byeon, Y.-H. Kim, "Semimetallicity and negative differential resistance from hybrid halide perovskite nanowires" Adv. Funct. Mater. 29, 1807620 (2019)
A. M. Ionescu et al. "Tunnel field-effect transistors as energy-efficient electronic switches" Nature, 479, 329 (2011)

SUMMARY

Embodiments of the inventive concept provide an organic-inorganic hybrid halide perovskite such as trimethylsulfonium lead triiodide ($TMSPbI_3$) based on a principle of negative differential resistance (NDR), which is a quantum mechanical hybridization rather than the conventional tunnel diode or resonance tunneling diode (RTD) device operation mechanisms, or a negative differential resistance mechanism based on nanowires corresponding to the same.

According to an exemplary embodiment, a negative differential resistance (NDR) based on an organic-inorganic hybrid halide perovskite nanowire, the negative differential resistance device includes a channel formed of an organic-inorganic hybrid halide perovskite crystal, and electrodes formed of its inorganic framework and physically and electrically connected to opposite ends of the channel.

The inorganic framework may include lead triiodide ($PbI_3$), which is composed of face-sharing halogen octahedra $PbI_6$ octahedra and has characteristics of a one-dimensional inorganic framework nanowire.

The channel may be formed of trimethylsulfonium lead triiodide (($CH_3)_3SPbI_3$), which is the organic-inorganic hybrid halide perovskite crystal having semiconducting characteristics and may be in a form inserted between the electrodes formed of lead triiodide ($PbI_3$), which is the inorganic nanowire derived from the same perovskite, in a direction of a nanowire axis.

The electrodes may be formed as the inorganic framework of lead triiodide ($PbI_3$) by removing trimethylsulfonium (($CH_3)_3S$) which is an organic ligand from trimethylsulfonium lead triiodide (($CH_3)_3SPbI_3$) which is the organic-inorganic hybrid halide perovskite crystal to exhibit metallic electrical characteristics in the negative differential resistance device.

In the channel and the electrodes, an organic ligand may be derived from the organic-inorganic hybrid halide perovskite crystal using a chemical etching to derive the inorganic nanowire.

According to another exemplary embodiment, a negative differential resistance (NDR) device based on an organic-inorganic hybrid halide perovskite bundled nanowires, the negative differential resistance device includes a negative differential resistance device in the form of a bundled 1D-nanowires constructed by utilizing the plurality of and combining multiple individual nanowires wherein the nanowire includes a channel formed of an organic-inorganic hybrid halide perovskite crystal, and electrodes formed of its inorganic framework and is connected to opposite ends of the channel.

The electrodes may be formed by removing an organic ligand from the organic-inorganic hybrid halide perovskite crystal using etching to be formed as the inorganic framework having metallic electrical characteristics.

The negative differential resistance device may be in a form in which multiple individual nanowires are bundled to form a circular 1D bundle single nanowire.

According to still another exemplary embodiment, a negative differential resistance (NDR) device based on an organic-inorganic hybrid halide perovskite nanoplatelet, the negative differential resistance device includes a negative differential resistance device in a bundled 2D-nanoplatelet form constructed by utilizing the plurality of and combining multiple nanowires wherein the nanowire includes a channel formed of an organic-inorganic hybrid halide perovskite crystal, and electrodes formed of its inorganic framework and is connected to opposite ends of the channel.

The electrodes may be formed by removing an organic ligand from the organic-inorganic hybrid halide perovskite crystal using etching to be formed as the inorganic framework having metallic electrical characteristics.

The negative differential resistance device may be in a form in which individual nanowires are bundled in a planar two-dimensional form.

According to still another exemplary embodiment, a negative differential resistance (NDR) device constructed by vertically stacking organic-inorganic hybrid halide perovskite bundled nanowires, the negative differential resistance device includes a negative differential resistance device includes each stacking layer in the form of bundled 1D-nanowire in which multiple individual nanowires are combined to form a bundle, wherein the nanowire includes a channel formed of an organic-inorganic hybrid halide perovskite crystal, and electrodes formed of its inorganic framework and is connected to opposite ends of the channel.

The electrodes may be formed by removing an organic ligand from the organic-inorganic hybrid halide perovskite crystal using etching to be formed as the inorganic framework having metallic electrical characteristics.

The negative differential resistance device may have a form in which the nanowires is separated into active devices and inorganic framework metallic nanowires through a lithography etching to allow the bundled nanowires to be integrated and connected to one another.

The negative differential resistance device may include the channel from 2 nanometers or less to several nanometers in a length to be manufactured or integrated in a size of several nanometers.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
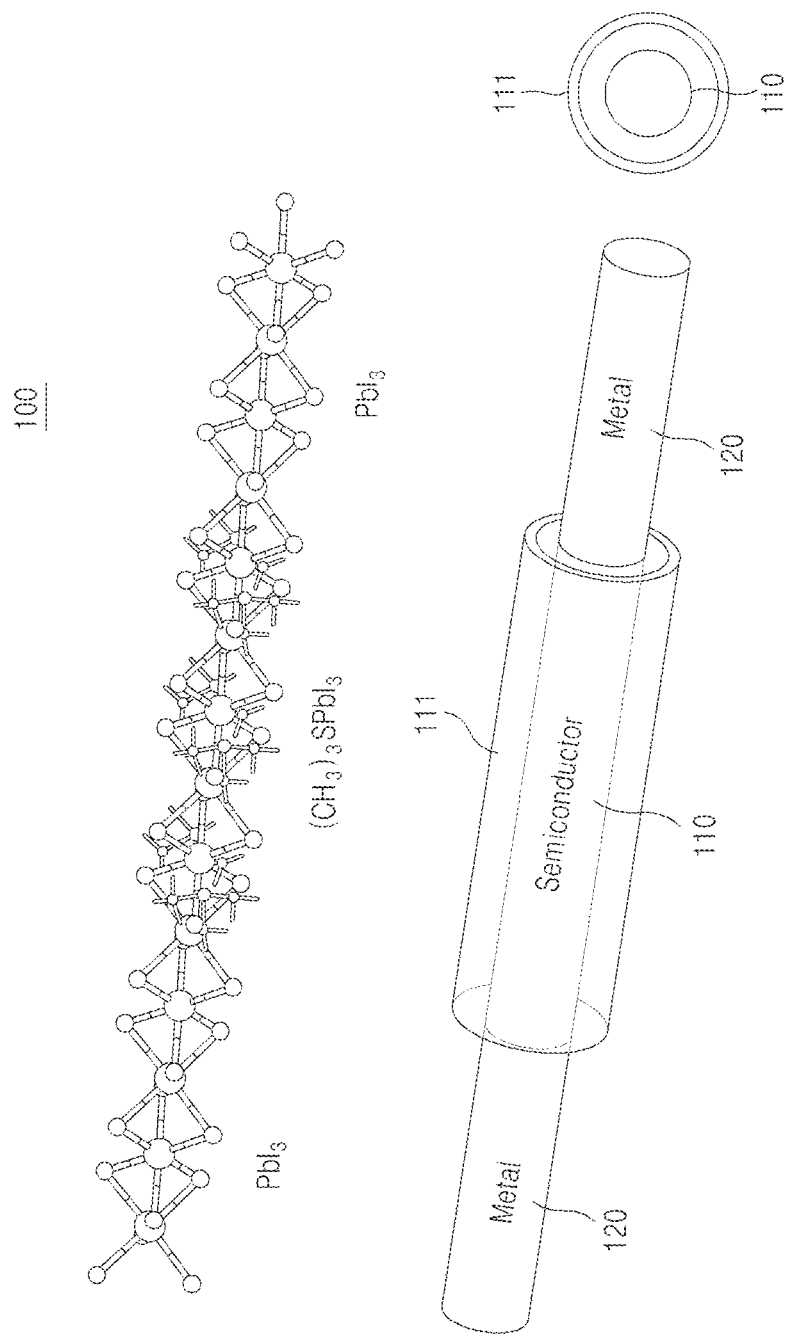
FIG. 1 illustrates an example of a structure of a negative differential resistance device based on a nanowire according to an embodiment of the inventive concept.

Hereinafter, embodiments according to the inventive concept will be described in detail with reference to the accompanying drawings. However, the inventive concept is not limited or confined by the embodiments. Also, like reference numerals in the drawings denote like elements.

In addition, terminology used herein is terms used to properly express preferred embodiments of the inventive concept, which varies depending on intention of a viewer or operator, or practice of the field to which the inventive concept belongs. Therefore, the definitions of the terms should be made based on the contents throughout the specification.

Embodiments of the inventive concept are directed to a negative differential resistance device based on a nanowire, which is based on a hybrid halide perovskite and an analogous material, and an integrated circuit implementation method.

In particular, the inventive concept provides a method of implementing a quantum device having a negative differential resistance (NDR) using nanowires, bundled nanowires and bundled nanoplatelets based on an organic-inorganic hybrid halide perovskite under a low voltage condition, and a method of horizontally arraying or vertically stacking nanowire devices and a method of connecting circuits.

Hereinafter, the inventive concept will be described with reference to FIGS. 1 to 5.

FIG. 1 illustrates an example of a structure of a negative differential resistance device based on a nanowire according to an embodiment of the inventive concept.

Referring to FIG. 1, a negative differential resistance device 100 according to an embodiment of the inventive concept is a negative differential resistance device having a negative differential resistance (NDR) based on an organic-inorganic hybrid halide perovskite.

The negative differential resistance device 100 according to an embodiment of the inventive concept includes a channel 110 and electrodes 120.

The channel 110 is formed of a semiconducting organic-inorganic hybrid halide perovskite crystal.

As illustrated in FIG. 1, the channel 110 may be formed of the semiconducting organic-inorganic hybrid halide perovskite crystal (TMSPbI$_3$ or trimethylsulfonium lead triiodide (($CH_3$)$_3$SPbI$_3$)). The channel 110 may be in a form of a junction inserted between electrodes 120, which are formed of an inorganic framework nanowire (e.g., lead triiodide, PbI$_3$) derived from the same perovskite as the channel 110, in a direction of a nanowire axis. In addition, the channel 110 may be disposed inside an organic ligand 111, which is crystallized around the inorganic framework.

Here, the organic-inorganic hybrid halide perovskite crystal (TMSPbI$_3$ or ($CH_3$)$_3$SPbI$_3$) has a hexagonal stack of one-dimensional 1D inorganic frameworks made of face-sharing halogen octahedrons (PbI$_6$). The organic-inorganic hybrid halide perovskite crystal (TMSPbI$_3$ or ($CH_3$)$_3$SPbI$_3$) has an isolated form in which individual anion 1D PbI$^{3-}$ column is surrounded by the organic ligands 111, which are two organic cations (($CH_3$)$_3$S$^+$) per unit cell UC, thereby providing a one-dimensional based crystal structure and good ambient stability.

The negative differential resistance device 100 according to an embodiment of the inventive concept includes the channel 110 formed of the organic-inorganic hybrid halide perovskite crystal (TMSPbI$_3$ or (CH$_3$)$_3$SPbI$_3$) surrounded by the organic ligand 111, thereby ensuring a high current density and the negative differential resistance (NDR).

The electrodes 120 are disposed on opposite sides of the channel 110 and are formed of lead triiodide (PbI$_3$) which is the inorganic framework which is formed by removing of trimethylsulfonium (TMS or (CH$_3$)$_3$S) organic ligand 111 from the organic-inorganic hybrid halide perovskite crystal.

Here, the inorganic framework may be a material which is utilized as the electrodes 120 of the negative differential resistance device 100 because the one-dimensional inorganic framework nanowires are formed with face-sharing halogen octaheda (e.g., PbI$_6$). That is, the inorganic framework may be lead triiodide (PbI$_3$), and the organic ligand may be trimethylsulfonium (CH$_3$)$_3$S.

The electrodes 120 may be formed by removing the organic ligands 111 (e.g. trimethylsulfonium, (CH$_3$)$_3$S) from the organic-inorganic hybrid halide perovskite crystal (e.g., trimethylsulfonium lead triiodide, (CH$_3$)$_3$SPbI$_3$)) by etching, thereby exhibiting metallic electrical characteristics in the negative differential resistance device 100.

More specifically, the electrodes 120 of lead triiodide (PbI$_3$), which is the inorganic framework of the perovskite crystal of trimethylsulfonium lead triiodide (TMSPbI$_3$ or (CH$_3$)$_3$SPbI$_3$), have a stable structure even when the organic ligand 111 is removed. In addition, the negative differential resistance device 100 of the lead triiodide (PbI$_3$) inorganic framework in which trimethylsulfonium (TMS or (CH$_3$)$_3$S) is separated from trimethylsulfonium lead triiodide (TMSPbI$_3$ or (CH$_3$)$_3$SPbI$_3$) may exhibit completely different electrical characteristics of metallicity.

Furthermore, in the channel 110 and the electrodes 120, the organic ligand 111 may be chemically etched from the organic-inorganic hybrid halide perovskite crystal to derive the inorganic framework nanowire.

That is, the inventive concept may implement a homogeneous quantum-effect device 100 including trimethylsulfonium lead triiodide (TMSPbI$_3$ or (CH$_3$)$_3$SPbI$_3$) having semiconductor characteristics used as the channel 110 and lead triiodide (PbI$_3$) having metallic characteristics used as the electrodes 120, thereby having a high current density (a range of about 900 kAcm$^{-2}$) due to interfacial characteristics close to an ohmic contact which is very low resistance at an interface between lead triiodide (PbI$_3$) and trimethylsulfonium lead triiodide (TMSPbI$_3$ or (CH$_3$)$_3$SPbI$_3$)) and exhibiting the negative differential resistance (NDR) with a very high peak-to-valley current ratio of about 20 even at a low voltage and room temperature.

Here, the negative differential resistance device 100 has a very excellent nonlinear negative differential resistance characteristics required for an ultra-low power and a multi-level next generation device. The negative differential resistance (NDR) characteristics of the inventive concept, unlike conventional tunnel diode or resonant tunneling diode (RTD), is a novel negative differential resistance mechanism based on quantum-mechanical hybridization in which a quantum hybridization state between two electrodes 120 collapses after a specific voltage, for example, about 0.5V, resulting in a sharp decrease in the amount of current.

Figure 2:
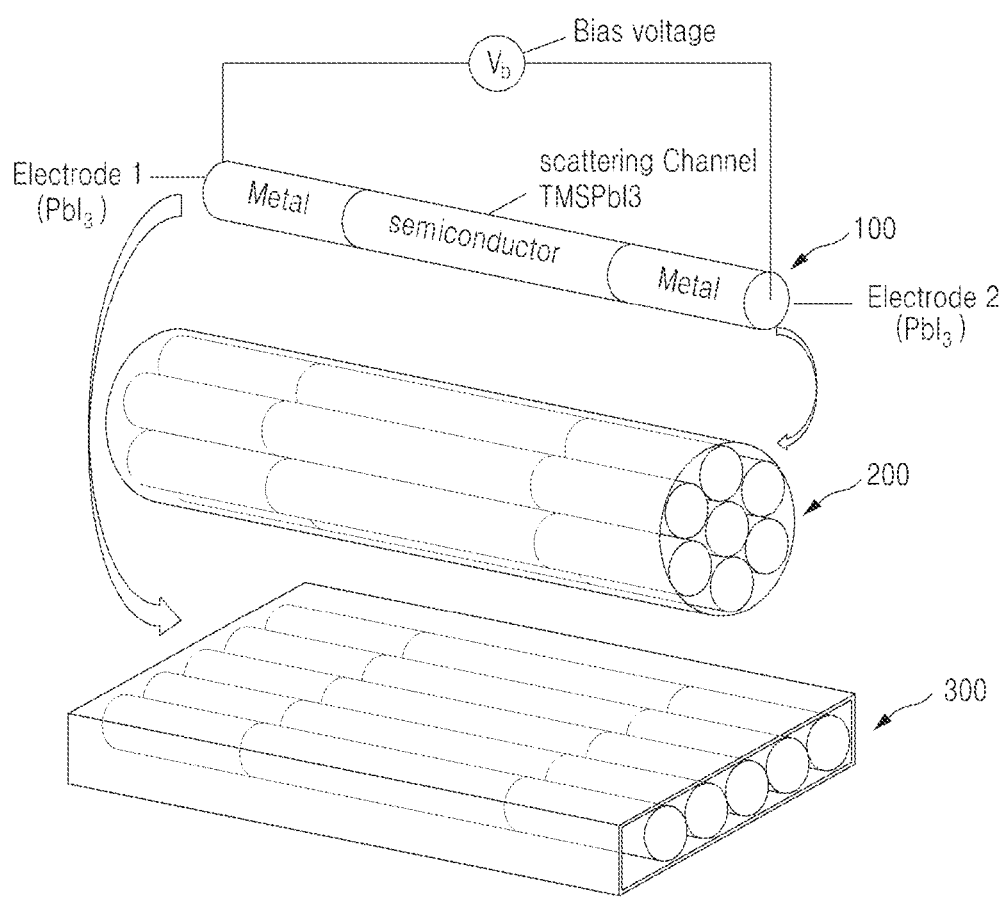
FIG. 2 illustrates examples of structures of negative differential resistance devices based on a nanowire, bundled nanowires, and bundled nanoplatelets according to an embodiment of the inventive concept.

FIG. 2 illustrates an example of a structure of a negative differential resistance device based on a nanowire, bundled nanowires, and bundled nanoplatelets according to an embodiment of the inventive concept.

Referring to FIG. 2, the negative differential resistance device 100 based on the nanowire according to an embodiment of the inventive concept, a negative differential resistance device 200 based bundled nanowires according to an embodiment of the inventive concept, and a negative differential resistance device 300 based on bundled nanoplatelets according to another embodiment of the inventive concept are illustrated.

The inventive concept may implement quantum-effect junction devices of nanowires, bundled nanowires, and bundled nanoplatelets using a single nanowire of the organic-inorganic hybrid halide perovskite. Therefore, the very excellent nonlinear negative differential resistance devices 100, 200, and 300, which is required for implementation of the ultra-low power and the multi-level next generation device may be implemented.

As shown in FIG. 2, the negative differential resistance device 100 based the nanowire according to an embodiment of the inventive concept includes the channel formed of the organic-inorganic hybrid halide perovskite crystal of trimethylsulfonium lead triiodide (TMSPbI$_3$ or (CH$_3$)$_3$SPbI$_3$) and the electrodes formed of lead triiodide (PbI$_3$).

The negative differential resistance device 200 based on bundled nanowires according to the embodiment of the inventive concept has a form of bundled 1D-nanowire in which a plurality of halide perovskite nanowires is combined into a circular bundle. In addition, the negative differential resistance device 300 based on the bundled nanoplatelets has a form of bundled 2D-nanoplatelet in which a plurality of halide perovskite nanowires is combined in a straight line.

Here, the halide perovskite nanowires constituting the negative differential resistance device 200 based on the bundled nanowires and the negative differential resistance device 300 based on the bundled nanoplatelets include the channel and the electrodes. The number and shape of the negative differential resistance device 100 based on the nanowire, which forms a shape of bundled 1D-nanowire and a shape of bundled 2D-nanoplatelet, are not limited thereto.

Figure 3:
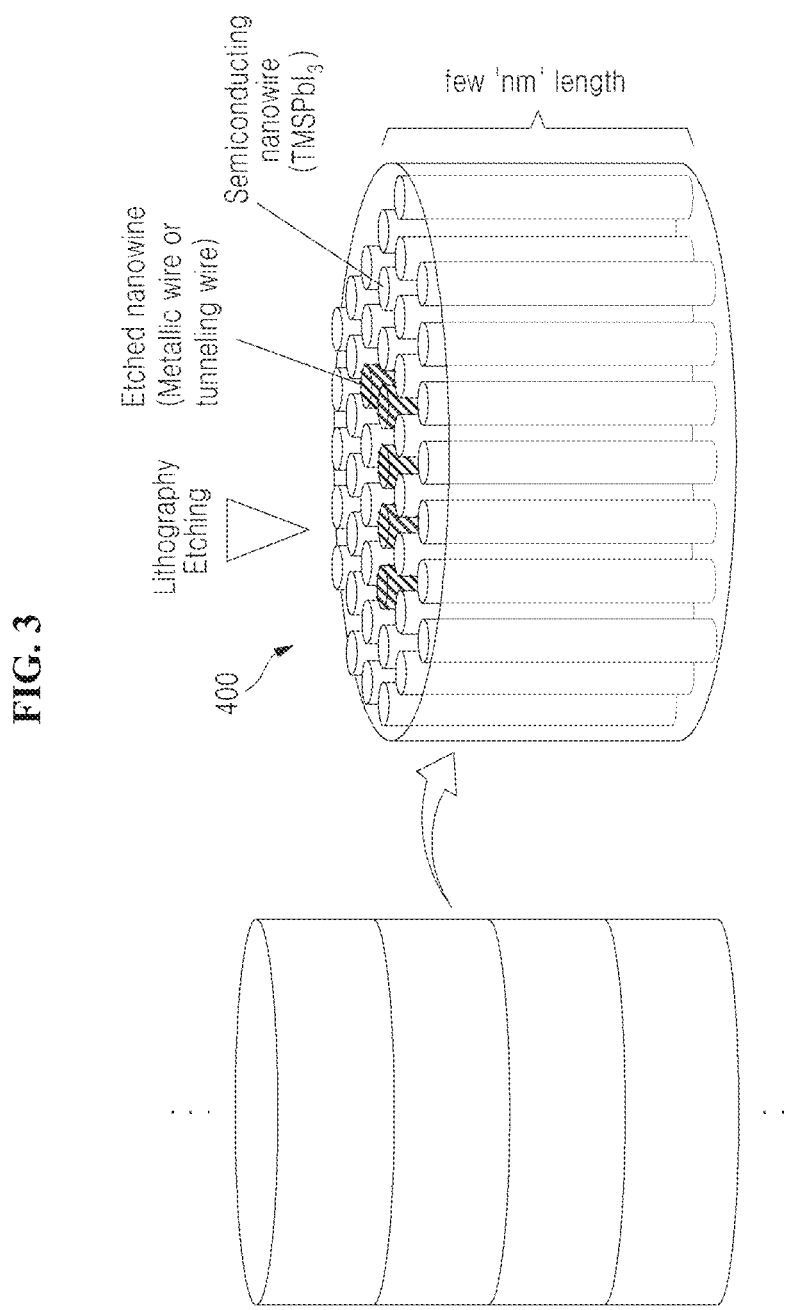
FIG. 3 illustrates an example of a structure of a negative differential resistance device in which bundled nanowires are vertically stacked according to another embodiment of the inventive concept.

FIG. 3 illustrates an example of a structure of a negative differential resistance device in which bundled nanowires are vertically stacked according to another embodiment of the inventive concept.

Referring to FIG. 3, according to another embodiment of the inventive concept, a negative differential resistance device 400, in which the negative differential resistance devices based on the bundled nanowires are stacked vertically to be integrated and connected to one another, implements a three-dimensional vertical stacked circuit in which 1D bundled nanowires, which combine a plurality of halide perovskite nanowires in to a circular bundle, are vertically stacked.

Here, according to another embodiment of the inventive concept, in the negative differential resistance device 400, in which the negative differential resistance devices based on the bundled nanowires are stacked vertically to be integrated and connected to one another, a specific bundle is separated as a quantum-effect device or an inorganic framework metallic wire (completely etched nanowires becoming metallic wires and partly etched wires becoming quantum-effect devices) using a lithography etching to perform integration in a form of bundled nanowires. In addition, according to another embodiment of the inventive concept, the negative differential resistance device 400, in which the negative differential resistance devices based on the bundled nanowires are stacked vertically to be integrated and connected to one another, may include a channel (semiconducting nanowire) capable of performing as a quantum-effect device even at several nanometers, thereby improving the integration degree of the device and interconnect process technology.

Figure 4:
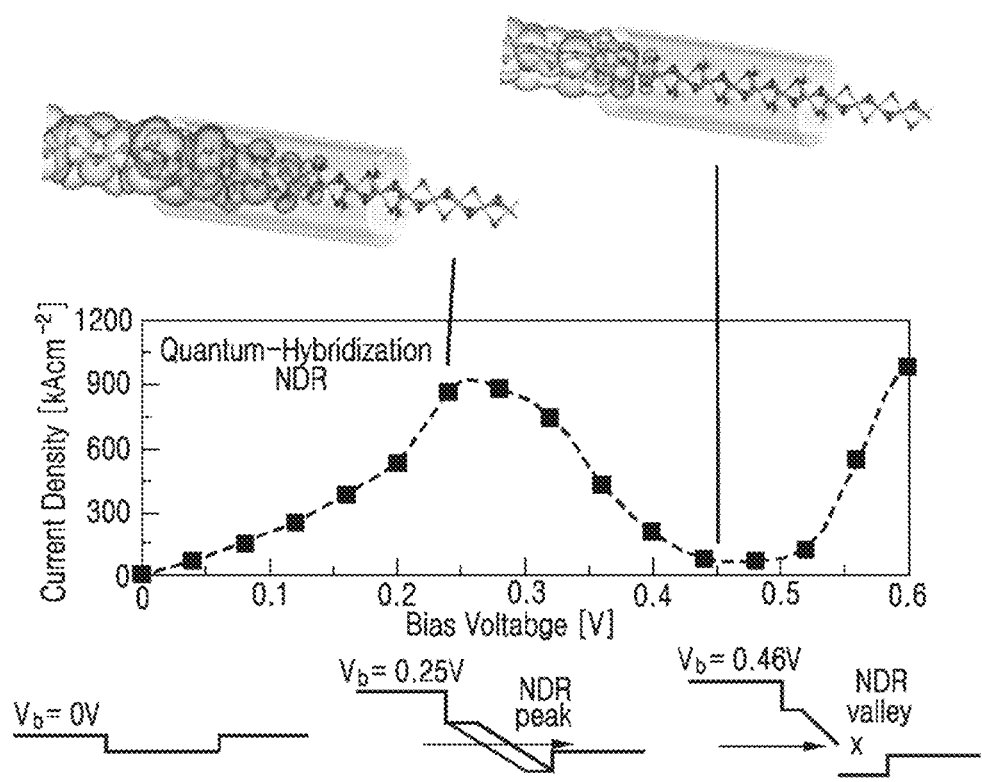
FIG. 4 illustrates a mechanism and characteristics of a negative differential resistance device according to an embodiment of the inventive concept.

FIG. 4 illustrates a mechanism and characteristics of a negative differential resistance device according to an embodiment of the inventive concept.

In detail, FIG. 4 shows a result graph illustrating a current-voltage curve and a high peak-to-valley ratio (PVR) of the negative differential resistance device based on the quantum mechanical hybridization and an energy band diagram illustrating a mechanism of the negative differential resistance device based on the quantum mechanical hybridization.

The negative differential resistance device based on the nanowire according to an embodiment of the inventive concept provides the quantum-effect device ($PbI_3$-$TMSPbI_3$—$PbI_3$) based on trimethylsulfonium lead triiodide ($TMSPbI_3$) using stability and metallic characteristics of lead triiodide ($PbI_3$) nanowire, which is the inorganic framework.

Referring to the current-voltage curve (a graph of FIG. 4) and the result graph illustrating the peak-to-valley ratio (PVR) (an upper portion of the FIG. 4) of the negative differential resistance device based on the quantum mechanical hybridization according to an embodiment of the inventive concept shown in FIG. 4, it may be seen that the negative differential resistance current-voltage curve generated in the low voltage condition. It may be seen that the high current density due to the interfacial characteristics between lead triiodide-trimethylsulfonium lead triiodide ($PbI_3$-$TMSPbI_3$), which are close to ohmic contact, is exhibited and the negative differential resistance characteristics having the high peak-to-valley current ration at the low voltage condition is exhibited, at the same time.

In addition, referring to the energy band diagram (a lower portion of FIG. 4) illustrating the mechanism of the negative differential resistance device based on the quantum mechanical hybridization according to an embodiment of the inventive concept, it may be seen that a hybridization degree of the two electrodes is changed depending on applied voltages of 0 V, 0.25 V, and 0.46 V through a valence band of semiconductor, and the hybridization is broken in an energy space under a condition of the applied voltage of 0.46 V. As a result, it may be seen that the negative differential resistance characteristics, which is the quantum hybridization NDR mechanism rather than the mechanism of the conventional NDR devices in which the amount of current flowing along the nanowires is decreased, are exhibited.

Here, the negative differential resistance refers to a phenomenon in which the voltage increases but the current decrease in a specific section as opposed to a normal case, thereby making the current-voltage characteristics curve non-linear like 'N' shape. Ultra-low power future semiconductor devices with a ternary system (using three logic states of '0', '1' and '2') which goes beyond an conventional device with a binary system (using '0' and '1' as logic state) may be developed using the non-linear negative differential resistance.

Figure 5:
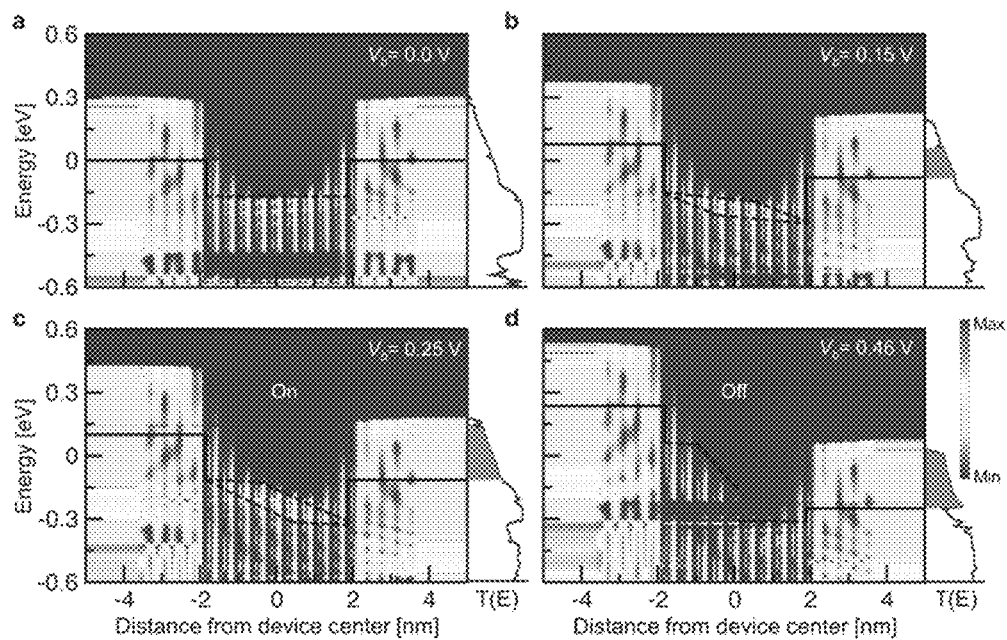
FIG. 5 is a view illustrating a change in a local state density depending on voltages applied to a negative differential resistance device according to an embodiment of the inventive concept.

FIG. 5 is a view illustrating a change in a local state density depending on voltages applied to a negative differential resistance device according to an embodiment of the inventive concept.

In detail, FIG. 5 illustrates energy band diagrams of a 4UC model depending on a voltage of a) Vb=0.0V, b) Vb=0.15V, c) Vb=0.25V, and d) Vb=0.46V applied to the negative differential resistance device based on the organic-inorganic hybrid halide perovskite nanowire according to an embodiment of the inventive concept. Thus, the change in the local state density depending on the voltage may be confirmed. Here, a solid line and a dotted line represent a Fermi level of the electrode of the lead triiodide ($PbI_3$) and a pseudo-Fermi level of the channel of trimethylsulfonium lead triiodide ($TMSPbI_3$), respectively.

Referring to FIG. 5, it may be seen that the negative differential resistance device based on the nanowire according to an embodiment of the inventive concept has the negative differential resistance (NDR) characteristics in which the quantum mechanical hybridization of the electrodes of metallic lead triiodide ($PbI_3$) which are disposed at the opposite sides of the channel is maintained at low voltage (Vb<0.45V) through the channel of semiconducting trimethylsulfonium lead triiodide ($TMSPbI_3$), but hybridization formation rapidly collapses and then the current is rapidly decreased when a high voltage (Vb>0.45V) is applied.

According to an embodiment of the inventive concept, the negative differential resistance (NDR) device based on the organic-inorganic hybrid halide perovskite nanowire is implemented to be capable of implementing an efficient device which supplements the problems of heat dissipation and power loss due to the low voltage range, a high peak-to-valley ratio, and the high current density compared to the conventional other NDR devices.

In addition, according to an embodiment of the inventive concept, the devices of one-dimensional bundled nanowires and two-dimensional nanoplatelets may be implemented based on the structurally stabilized nanowires to be applied to various types of devices.

Furthermore, according to an embodiment of the inventive concept, the homogeneous quantum-effect devices having the short semiconducting channel lengths of less than 2 nm to several nm in length may be manufactured by the ligand etching in addition to the low dimensions, thereby increasing the overall integration of the devices such as vertically stacked devices.

In addition, conventionally, it is limited to the diode application due to the NDR characteristics depending on only one current direction. However, the embodiments of the inventive concept may be applied to various devices without depending on the current direction.

In the case of a DRAM or a flash memory, which is most used in a current memory semiconductor field, a memory storage is basically stored through a division of 0 and 1 based on a charge. On the other hand, when using the negative differential resistance device according to an embodiment of the inventive concept, the memory device based on the ternary system rather than the conventional binary system may be implemented to improve the integration degree compared to the conventional memory semiconductor and the limitations of down scale which is an issue in the memory semiconductor filed is solved to allow the new memory devices are capable of replacing the basic silicon-based memory devices to be applied.

Furthermore, the negative differential resistance device according to the embodiment of the inventive concept may be applied to the non-memory semiconductor field, and may solve the limitation of the down scale which is the biggest problem to allow the new logic device which is capable of replacing the next-generation logic device to be applied.

Although the embodiments have been described with reference to the limited embodiments and drawings as described above, various modifications and variations are possible to those skilled in the art from the above description. For example, although the described techniques are performed in a different order than the described method or the described components of the system, structure, apparatus, and circuits are combined in a different form than the described method, or replaced or substituted by other components or equivalents, appropriate results may be achieved.

Therefore, other implementations, other embodiments, and equivalents to the claims also fall within the scope of the appended claims.

What is claimed is:

1. A negative differential resistance (NDR) device based on an organic-inorganic hybrid halide perovskite nanowire, the negative differential resistance device comprising:
    a channel formed of an organic-inorganic hybrid halide perovskite crystal, and
    electrodes formed of an inorganic framework;
    the inorganic framework being the same material as the inorganic portion of the hybrid halide perovskite crystal and electrically connected to opposite ends of the channel.

2. The negative differential resistance device of claim 1, wherein the inorganic framework includes lead triiodide ($PbI_3$) which is composed of face-sharing halogen octahedra $PbI_6$ and has characteristics of a one-dimensional inorganic nanowire.

3. The negative differential resistance device of claim 2, wherein the channel is formed of trimethylsulfonium lead triiodide ($(CH_3)_3SPbI_3$), which is the organic-inorganic hybrid halide perovskite crystal having semiconducting characteristics and is in a form inserted between the electrodes formed of lead triiodide ($PbI_3$), which is the inorganic nanowire derived from the same perovskite, in a direction of a nanowire axis.

4. The negative differential resistance device of claim 2, wherein the electrodes are formed as the inorganic framework of lead triiodide ($PbI_3$) by removing trimethylsulfonium ($(CH_3)_3S$) which is an organic ligand from trimethylsulfonium lead triiodide ($(CH_3)_3SPbI3$) which is the organic-inorganic hybrid halide perovskite crystal to exhibit metallic electrical characteristics in the negative differential resistance device.

5. The negative differential resistance device of claim 1, wherein in the channel and the electrodes, an organic ligand is derived from the organic-inorganic hybrid halide perovskite crystal using a chemical etching to derive the inorganic nanowire.

6. A negative differential resistance (NDR) device based on an organic-inorganic hybrid halide perovskite bundled nanowires, the negative differential resistance device comprising:
    a negative differential resistance device in the form of bundled TD-nanowires constructed by utilizing the plurality of and combining multiple individual nanowires, wherein the nanowire includes:
    a channel formed of an organic-inorganic hybrid halide perovskite crystal; and
    electrodes formed of an inorganic framework;
    the inorganic framework being the same material as the inorganic portion of the hybrid halide perovskite crystal and electrically connected to opposite ends of the channel.

7. The negative differential resistance device of claim 6, wherein the electrodes are formed by removing an organic ligand from the organic-inorganic hybrid halide perovskite crystal using etching to be formed as the inorganic framework having metallic electrical characteristics.

8. The negative differential resistance device of claim 6, wherein the negative differential resistance device is in a form in which multiple individual nanowires are bundled to form a circular 1D single nanowire.

* * * * *